US008835953B2

(12) United States Patent
Liu et al.

(10) Patent No.: US 8,835,953 B2
(45) Date of Patent: Sep. 16, 2014

(54) LIGHTING DEVICE COMPRISING LEDS WITH PHOSPHOR LAYERS

(75) Inventors: Wen-Huang Liu, Hsinchu (TW); Trung-Tri Doan, Hsinchu (TW); Chuong-Anh Tran, Hsinchu (TW)

(73) Assignee: Semileds Optoelectronics Co., Ltd. (TW)

( * ) Notice: Subject to any disclaimer, the term of this patent is extended or adjusted under 35 U.S.C. 154(b) by 581 days.

(21) Appl. No.: 13/203,234

(22) PCT Filed: Mar. 11, 2010

(86) PCT No.: PCT/CN2010/070995
§ 371 (c)(1),
(2), (4) Date: Aug. 24, 2011

(87) PCT Pub. No.: WO2010/102576
PCT Pub. Date: Sep. 16, 2010

(65) Prior Publication Data
US 2011/0309390 A1  Dec. 22, 2011

(30) Foreign Application Priority Data
Mar. 11, 2009  (CN) .......................... 2009 1 0126493

(51) Int. Cl.
*H01L 33/08* (2010.01)
*H01L 33/60* (2010.01)
*H01L 25/075* (2006.01)
*H01L 33/50* (2010.01)

(52) U.S. Cl.
CPC .......... *H01L 25/0753* (2013.01); *H01L 33/508* (2013.01); *H01L 33/507* (2013.01)
USPC ............................................... 257/98; 257/99

(58) Field of Classification Search
USPC ................. 257/88–103, 431–448, E33.61
See application file for complete search history.

(56) References Cited

U.S. PATENT DOCUMENTS

2008/0128735 A1*  6/2008  Yoo et al. ........................ 257/98

FOREIGN PATENT DOCUMENTS

| CN | 1854863 A | 11/2006 | .......... G02F 1/13357 |
| CN | 101142694 A | 3/2008 | .............. H01L 33/00 |
| EP | 1 566 426 A2 | 8/2005 | .............. C09K 11/77 |
| JP | 11-260135 | 9/1999 | ................ F21V 8/00 |
| JP | 2008034188 A | 2/2008 | .............. F21V 19/00 |
| JP | 2008060129 A | 3/2008 | .............. H01L 33/00 |

* cited by examiner

*Primary Examiner* — Cuong Q Nguyen
(74) *Attorney, Agent, or Firm* — Martine Penilla Group, LLP

(57) ABSTRACT

A lighting device comprising LEDs with phosphor layers includes a plurality of LED sets which can emit light with a peak emission wavelength between 360 nm and 490 nm; and a plurality of sets of phosphor layers covering the corresponding LED sets among the plurality of LED sets. At least two of the plurality of LED sets respectively have peak emission wavelength different from each other. The dominant fluorescence wavelength of at least one of the plurality of sets of phosphor layers ranges from 500 nm to 580 nm, and the dominant fluorescence wavelength of at least one of the other sets of phosphor layers ranges from 590 nm to 650 nm.

62 Claims, 13 Drawing Sheets

Blue LED with Green Phosphor Layer

Blue LED with Red Phosphor Layer

LIGHTING DEVICE COMPRISING LEDS WITH PHOSPHOR LAYERS

CLAIM OF PRIORITY

This application claims priority as a Section 371 National Stage Application of International Application No. PCT/CN2010/070995, filed on Mar. 11, 2010, and was not published in English under PCT Article 21(2). The disclosure of the prior international application is incorporated herein by reference.

BACKGROUND OF THE INVENTION

1. Technical Field

The present invention relates to a lighting device, and particularly relates to a lighting device comprising light emitting diodes (LEDs) with phosphor layers.

2. Description of the Prior Art

In recent years, blue LEDs are often combined with fluorescent materials to produce lighting devices which can emit white light. Such lighting devices are often used as backlight sources of LCD monitors, traffic signals, illuminated switches, or indicators. Moreover, since the LEDs taken as light sources in the lighting devices only require a low current to operate, the energy consumed by these lighting devices can be considerably reduced in comparison with conventional incandescent lamps or fluorescent lamps. In addition, lighting devices using LEDs as light sources can have a longer service life than that of conventional incandescent lamps or fluorescent lamps.

FIG. 1 is a schematic diagram showing a conventional lighting device employing a combination of a blue LED and a mixed fluorescent material. A blue LED 102 is disposed on a substrate 101, and an input terminal 105 is connected to the blue LED 102 for providing electric energy to the lighting device. The blue LED 102 is covered with a mixed fluorescent material coating 103 comprising fluorescent materials which can be excited by the blue LED 102 to emit red light and green light. Furthermore, the lighting device is covered with a transparent hemispherical enclosure 104 to protect the blue LED 102 and the mixed fluorescent material coating 103 therein from the influence of moisture. However, for the lighting device of such design, the green light emitted by the mixed fluorescent material coating 103 due to excitation by the blue LED 102 is reabsorbed by the material capable of emitting red fluorescent light, which causes the luminescence efficiency (i.e. lumens per watt, lumens/W) of green light to decrease, and thus the luminescence efficiency of the entire lighting device is affected.

For the problem that the green light is absorbed by the material capable of emitting red fluorescent light, in U.S. Pat. No. 7,250,715, one blue LED is covered with separated fluorescent materials which can emit yellow-green fluorescent light and red fluorescent light respectively. As shown in FIG. 2, a blue LED 202 is disposed in a reflection cup 200 having a reflective inner surface and covered with adjacent fluorescent material layers 204 and 206 which are capable of emitting yellow-green fluorescent light and red fluorescent light respectively. By exciting the fluorescent material layers 204 and 206 to respectively emit yellow-green light and red light, the abovementioned problem of green light being absorbed can be solved. However, since the fluorescent material layers 204 and 206 are coated on the same blue LED 202, the luminescence efficiency cannot be optimized due to the mutual influence of the fluorescent material layers 204 and 206. In other words, if a blue LED is chosen for improving the luminescent efficiency of the fluorescent material layer 204, such blue LED does not necessarily result in an optimized luminescent efficiency of the fluorescent material layer 206, and vice versa.

SUMMARY OF THE INVENTION

The present invention is designed in full consideration of the situation above. The object of the present invention is to separate a conventional mixed fluorescent material coating into at least two sets of fluorescent material coatings having different fluorescence dominant wavelengths (i.e. different colors), wherein the sets of fluorescent material coatings can emit fluorescence of different dominant fluorescence wavelengths by being excited by corresponding LEDs in at least two blue LED sets. In addition to solving the above problem that the green light is absorbed, in the present invention, an optimum combination of the LEDs and fluorescent material coatings can be chosen based on demands and purposes, so as to achieve the maximum luminescence efficiency of the lighting device. Besides, with adequate circuit designs, operational ICs and power supplies, the at least two blue LED sets can be supplied with the same or different electrical currents for respectively exciting the corresponding fluorescent material coatings, so that white lights of different color temperatures can be emitted from a single lighting device according to usage environment, demand and time.

The present invention provides a lighting device having LEDs with phosphor layers, comprising: a plurality of LED sets which can emit lights having peak emission wavelengths within the range between 360 nm and 490 nm; and a plurality of sets of phosphor layers respectively coated on the plurality of LED sets. At least two of the plurality of LED sets have peak emission wavelengths different from each other. At least one of the plurality of sets of phosphor layers has a dominant wavelength ranging from 500 nm to 580 nm, and at least another one of the plurality of sets of phosphor layers has a dominant wavelength ranging from 590 nm to 650 nm. It should be understood by those skilled in the art that, as is well known and accepted, a "dominant wavelength" is a perceived color of the spectrum, namely, a single light wavelength producing a color sense that is most similar to the color sense perceived from a visible light source; and a "peak wavelength" is the spectral line of maximum power in the spectral power distribution of a light source. The lighting device of the present invention emits white light by mixing the light emitted by the plurality of LED sets with the fluorescence of the plurality of sets of phosphor layers excited by the LEDs.

The lighting device recited in the technical solution proposed by the present invention has a higher luminescence efficiency.

BRIEF DESCRIPTION OF THE DRAWINGS

The present invention will easily be understood with reference to the following description and accompanying drawings, and similar constituent elements are given the same reference numerals.

DETAILED DESCRIPTION OF THE PREFERRED EMBODIMENTS

The present invention will be described with reference to the accompanying drawings, which are taken as a part of the detailed description.

A number of specific embodiments are set forth to provide a thorough understanding of the present invention. However, it is obvious for those skilled in the art that the present invention may be practiced without part or all of these specific details. In other examples, operations that are already known will not be further described to avoid any confusion.

For the convenience of description, in the following embodiments and accompanying drawings, twp LED sets and two sets of phosphor layers are used to represent the number of the LED sets and sets of phosphor layers in the lighting device. However, in the embodiments and accompanying drawings of the present invention, the two LED sets and two sets of phosphor layers should be considered exemplary but not limiting. In other words, the number of LED sets in the lighting device can be two or more, and the number of sets of phosphor layers on the LED sets can be two or more as well.

Figure 3A:
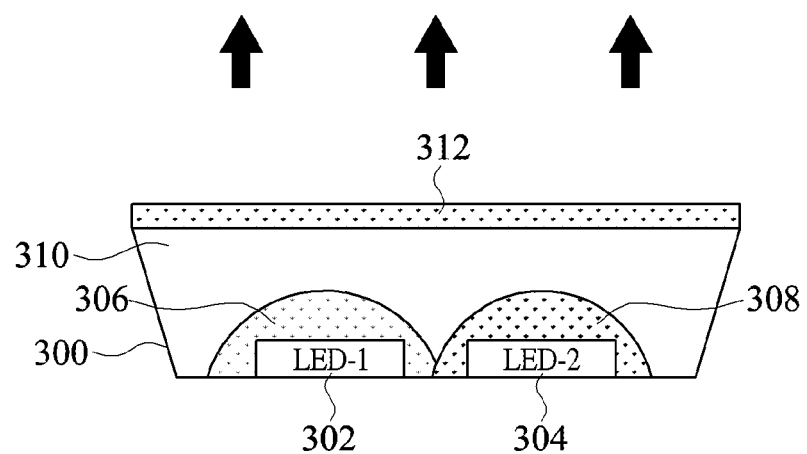
FIG. 3A is a cross-sectional view showing the lighting device according to an embodiment of the present invention.

FIG. 3A is a cross-sectional view showing a lighting device according to an embodiment of the present invention. The number 300 represents a concave structure with a reflective inner surface (hereinafter, a reflection cup). A first LED set 302 and a second LED set 304 are disposed in the reflection cup 300. The first LED set 302 and the second LED set 304 are selected from, but not limited to, the following compounds composed of Group III-V elements: GaN, AlN, InN, AlGaN, and InGaN. The peak emission wavelengths of the first LED set 302 and second LED set 304 are within a range between 360 nm and 490 nm, and the first and second LED sets 302 and 304 may have different peak emission wavelengths.

Figure 3B:
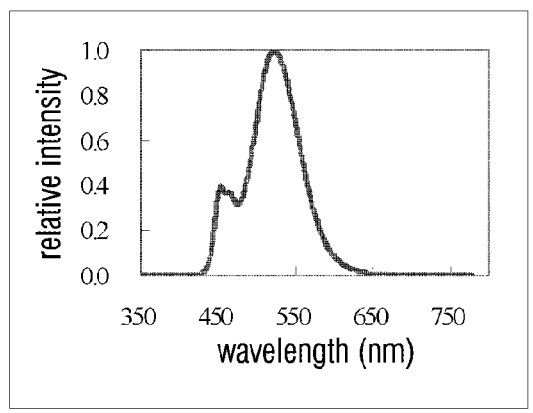
FIGS. 3B and 3C illustrate optical spectrums of blue LEDs respectively comprising a green phosphor layer and a red phosphor layer according to an embodiment of the present invention.
Figure 3C:
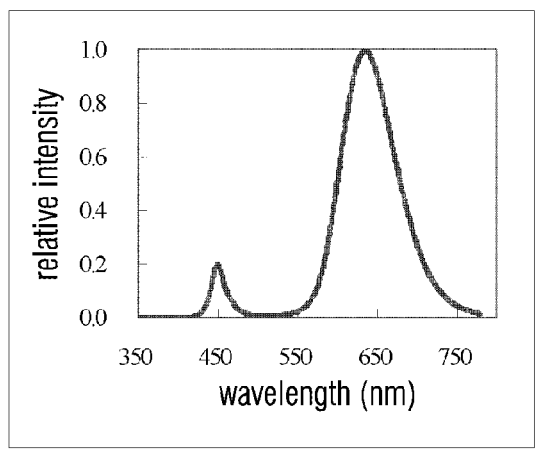

Next, an input terminal (not shown) is connected to the first LED set 302 and the second LED set 304 respectively, to provide the desired electric energy to the first LED set 302 and the second LED set 304. A first set of phosphor layers 306 and second set of phosphor layers 308 are coated on the first LED set 302 and second LED set 304 respectively. The overlapped portion of the first and second sets of phosphor layers 306 and 308 is preferably minimized. More preferably, the first and second sets of phosphor layers 306 and 308 adjacently contact with each other without overlapping. Each of the first and second sets of phosphor layers 306 and 308 can be a single fluorescent layer or multiple fluorescent layers, and the surface thereof can be hemispherical, convex, or planar. Referring to FIGS. 3B and 3C, the first set of phosphor layers 306 can be excited by the light emitted by the first LED set 302, thereby emitting fluorescence with a dominant wavelength ranging from 500 nm to 580 nm. On the other hand, the second set of phosphor layers 308 can be excited by the light emitted by the second LED set 304, thereby emitting fluorescence with a dominant wavelength ranging from 590 nm to 650 nm.

Next, referring again to FIG. 3A, a transparent layer 310 can be configured to cover the first LED set 302, the second LED set 304, the first set of phosphor layers 306 and the second set of phosphor layers 308, to prevent these elements from the influence of moisture. The transparent layer 310 can include at least one of a transparent polymeric material (such as epoxy, silicone, polyimide, acryl, polycarbonate (PC), or parylene), and a transparent material such as quartz or glass. Further, the structure of the transparent layer 310 can be single-layered or multi-layered. Moreover, a diffusion layer 312 is disposed on the transparent layer 310, so that the light emitted by the first LED set 302 and the second LED set 304 can mix more uniformly with the fluorescence emitted by the excited first and second sets of phosphor layers 306 and 308 to obtain white light. Further, another function of the transparent layer 310 is enabling the light reflected from the interface between the transparent layer 310 and materials thereon (such as the diffusion layer 312) due to a difference in refractive indices or an influence of interlayer grain molecules to be directed to the reflective inner surface of the reflection cup 300 more possibly, but not to be absorbed by the first set of phosphor layers 306 and the second set of phosphor layers 308, thereby improving the luminescence efficiency. In addition, the reflection cup 300 can refract the light emitted by an LED or reflected from structural interfaces above the LED to an exit direction (as shown by the arrow), thereby increasing the luminescence efficiency.

Figure 4:
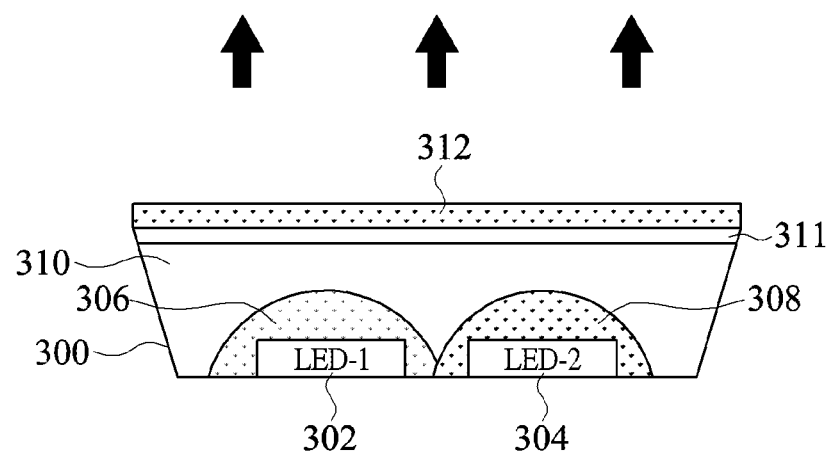
FIG. 4 is a cross-sectional view showing another lighting device according to an embodiment of the present invention.

FIG. 4 is a cross-sectional view showing another lighting device according to an embodiment of the present invention. The difference compared to the lighting device shown in FIG. 3A is that an anti-reflective coating (ARC) 311 is added between the transparent layer 310 and the diffusion layer 312. The ARC 311 can be formed by using at least one of spin-coating, dip-coating, chemical vapor deposition (CVD), thermal evaporation coating, and e-beam evaporation coating. The ARC 311 can include but is not limited to a transparent layer of at least one of nitrocellulose, cellulose esters, cellulose acetate, cellulose acetate butyrate, Teflon, Cytop, $SiO_2$, $SiN_x$, $SiO_xN_y$, $TiO_2$, MgO, and $MgF_2$. The ARC 311 can be configured to let the light produced in the reflection cup 300 (including the light emitted by the first LED set 302 and the second LED set 304, the light emitted by the excited first and second sets of phosphor layers 306 and 308, and the light reflected from the reflection cup 300) pass through, and enable the light scattered by the interlayer grain molecules in the diffusion layer 312 to be refracted back to the exit direction (as shown by the arrow) on the interface between the diffusion layer 312 and the ARC 311, thereby increasing the luminescence efficiency of the lighting device.

Figure 5:
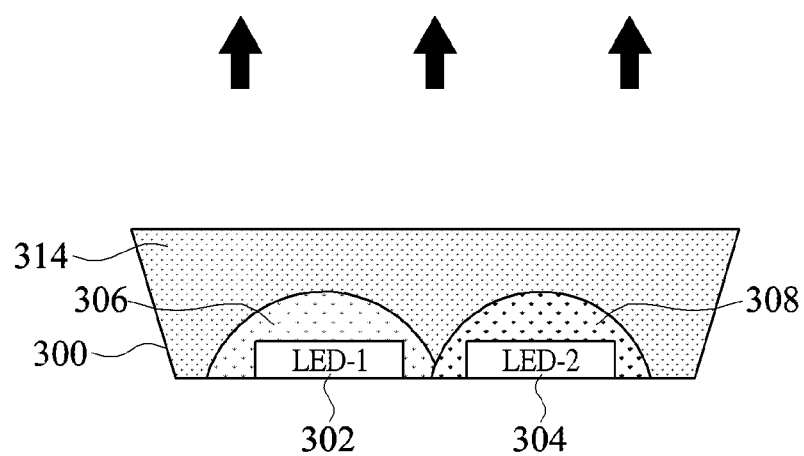
FIG. 5 is a cross-sectional view showing another lighting device with a diffusion layer and a transparent layer according to an embodiment of the present invention.

Also, as shown in FIG. 5, a diffusion layer 314 having a coating function can be formed by combining the transparent layer 310 and the diffusion layer 312 in FIG. 3A, so as to protect the first LED set 302, the second LED set 304, the first set of phosphor layers 306, and the second set of phosphor layers 308 in the reflection cup 300, while mix the light emitted by the first and second LED sets 302 and 304 more uniformly with the fluorescence emitted by the excited first and second sets of phosphor layers 306 and 308 to produce white light.

Figure 6A:
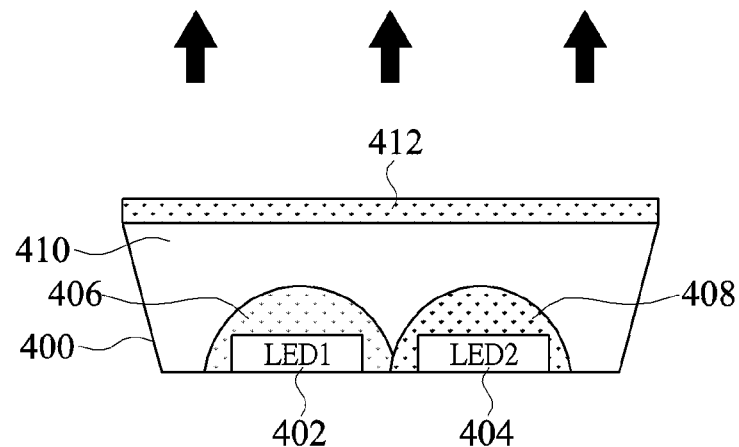
FIG. 6A is a cross-sectional view showing that the first and the second LED sets according to an embodiment of the present invention have two LED units respectively.
Figure 6B:
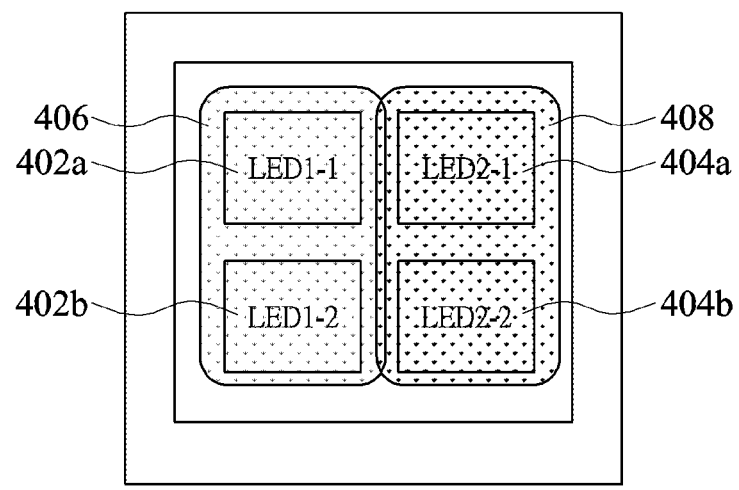
FIG. 6B is a top view of the structure shown in FIG. 6A.

It should be understood that, according to operational requirements and purposes, one or more LED units can be disposed in each of the plurality of LED sets of the lighting device of the present invention. In other words, each of the plurality of LED sets can be respectively provided with one or more LED units. FIG. 6A is a cross-sectional view showing that the first and the second LED sets according to an embodiment of the present invention have two LED units respectively. FIG. 6B is a top view of the structure shown in FIG. 6A. As shown in FIG. 6A, a first LED set 402 and a second LED set 404 are disposed in a concave structure with a reflective inner surface (hereinafter, a reflection cup) 400. The first and second LED sets 402 and 404 are selected from but not limited to the following compounds composed of Group III-V elements: GaN, MN, InN, AlGaN, and InGaN. As shown in FIG. 6B, the first LED set 402 includes two LED units 402a and 402b; and the second LED set 404 includes two LED units 404a and 404b. The peak emission wavelengths of the first LED set 402 and second LED set 404 may be within a range between 360 nm and 490 nm, and these two LED sets 402 and 404 may have different peak emission wavelengths. It should be appreciated that only two LED units are shown in each of the LED sets in the lighting device in FIGS. 6A and 6B, but the lighting device is not limited thereto in practice, that is, each of the LED sets can be provided with one or more LED units. Additionally, the sizes of each of the plurality of LED units in each of the LED sets can be the same or different from one another.

Next, an input terminal (not shown) is connected to the first LED set 402 and the second LED set 404 respectively for providing the desired electric energy thereto. A first set of phosphor layers 406 and second set of phosphor layers 408 are respectively coated on the first LED set 402 and second LED set 404. The overlapped portion of the first and second sets of phosphor layers 406 and 408 is preferably minimized. More preferably, the first and second sets of phosphor layers 406 and 408 adjacently contact with each other without overlapping. Each of the first and second sets of phosphor layers 406 and 408 can be a single fluorescent layer or multiple fluorescent layers, and the surface thereof can be hemispherical, convex, or planar. Moreover, based on demand or purpose, the first set of phosphor layers 406 and second set of phosphor layers 408 may be configured to respectively cover different amounts of LED units. For example, according to demand or purpose, the first LED set 402 can be configured to include only several LED units which are covered with the first set of phosphor layers 406, while the second LED set 404 is configured to include LED units of which the amount is different from that of the LED units in the first LED set 402, and which are covered with the second set of phosphor layers 408. Referring to FIGS. 3B and 3C, the first set of phosphor layers 406 can be excited by the light emitted by the first LED set 402, thereby emitting fluorescence with a dominant wavelength ranging from 500 nm to 580 nm. On the other hand, the second set of phosphor layers 408 can be excited by the light emitted by the second LED set 404, thereby emitting fluorescence with a dominant wavelength ranging from 590 nm to 650 nm.

Next, referring again to FIG. 6A, a transparent layer 410 can be disposed for covering the first LED set 402, the second LED set 404, the first set of phosphor layers 406 and the second set of phosphor layers 408, to prevent these elements from the influence of moisture. The transparent layer 410 can include at least one of transparent polymeric materials, such as epoxy, silicone, polyimide, acryl, polycarbonate (PC), or parylene, and transparent materials such as quartz or glass. Besides, the structure of the transparent layer 410 can be single-layered or multi-layered. Moreover, a diffusion layer 412 is disposed on the transparent layer 410, so that the light emitted by the first LED set 402 and the second LED set 404 can mix more uniformly with the fluorescence emitted by the excited first and second sets of phosphor layers 406 and 408 to obtain white light. Further, another function of the transparent layer 410 is enabling the light reflected from the interface between the transparent layer 410 and materials thereon (such as the diffusion layer 412) due to a difference of refractive indices or an influence of interlayer grain molecules to be directed to the reflective inner surface of the reflection cup 400 more possibly, but not to be absorbed by the first set of phosphor layers 406 and the second set of phosphor layers 408, thereby improving the luminescence efficiency. In addition, the reflection cup 400 can refract the light emitted by an LED or reflected from structural interfaces above the LED to an exit direction (as shown by the arrow), thereby increasing the luminescence efficiency.

Additionally, the plurality of LED sets in the lighting device can be serially or parallelly connected according to operational purposes or requirements. In conjunction with adequate circuit designs, operation ICs and power supplies, the plurality of LED sets can also be operated simultaneously or respectively with the same or different operation currents. Also, according to operational purposes or requirements, the plurality of LED units in each of the LED sets can also be serially or parallelly connected, and operated simultaneously or respectively with the same or different operation currents in conjunction with adequate circuit designs, operation ICs and power supplies.

Figure 7A:
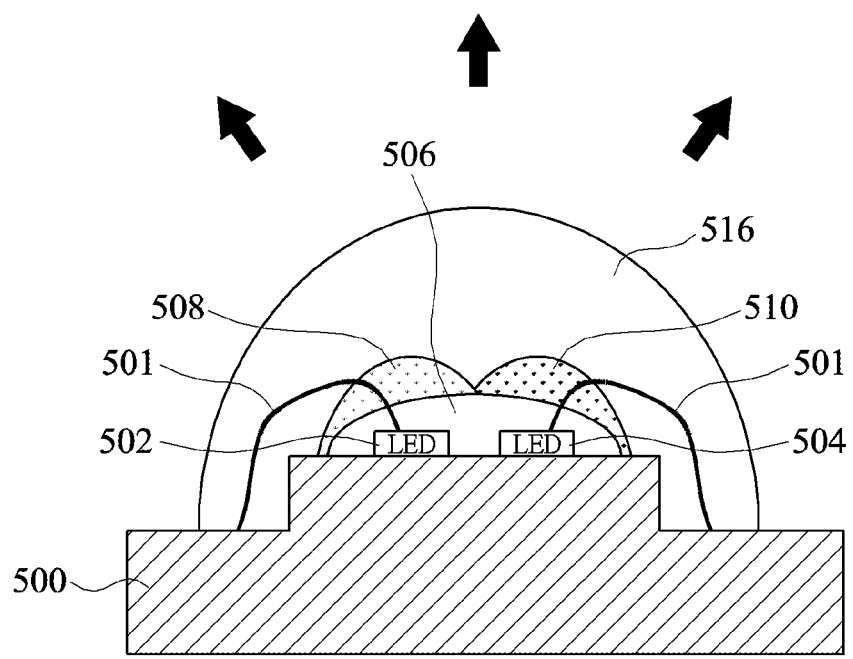
FIG. 7A is a cross-sectional view showing a lighting device with an LED attached to the surface of a base according to an embodiment of the present invention.

Also, the present invention can be applied to a lighting device comprising surface adhesive type LEDs. FIG. 7A is a cross-sectional view showing a lighting device with LEDs adhered to the surface of a base according to an embodiment of the present invention. A first LED set 502 and a second LED set 504 are adhered onto a base 500, wherein the base 500 can be formed of semiconductors, metals, ceramics, or metal matrix composites (MMCs). The first and second LED sets 502 and 504 are selected from but not limited to the following compounds composed of Group III-V elements: GaN, MN, InN, AlGaN, and InGaN. A reflective surface (not shown) is disposed on the base 500 at the positions where the first and the second LED sets 502 and 504 are mounted. As described above, the reflective surface is able to refract the light emitted by an LED or the light reflected from a structural interface above the LED to an exit direction (as shown by the arrow), thereby increasing the luminescence efficiency. The peak emission wavelengths of the light emitted by the first and second LED sets 502 and 504, which may be different from each other, are within the range between 360 nm and 490 nm. As the abovementioned description, the first LED set 502 and the second LED set 504 can be provided with one or more LED units respectively for operational requirements and purposes. And the amount of the LED units in the LED set 502 is not necessarily the same as that in the LED set 504. In addition, the sizes of the plurality of LED units in each of the LED sets can be the same or different from one another.

Next, an input terminal 501 is connected to the first LED set 502 and the second LED set 504 respectively to provide required electric energy thereto for emitting light. A transparent layer 506 is configured to be coated on the first LED set 502 and the second LED set 504 to prevent these elements from the influence of moisture. The transparent layer 506 can include at least one of a transparent polymeric material (such as epoxy, silicone, polyimide, acryl, polycarbonate (PC), or parylene), and a transparent material such as quartz or glass. In addition, the structure of the transparent layer 506 can be single-layered or multi-layered, while the transparent layer 506 can be hemisphere, convex, tapered, or Fresnel-lens-shaped, and an adequate shape is selected according to operational purposes or requirements for achieving a best extraction for the light emitted by the first LED set 502 and the second LED set 504.

Next, at positions on the transparent layer 506 which correspond to the first LED set 502 and second LED set 504, a first set of phosphor layers 508 and a second set of phosphor layers 510 are configured to respectively cover the first LED set 502 and the second LED set 504, wherein the overlapped portion of the first and second sets of phosphor layers 508 and 510 is preferably minimized. More preferably, the first and second sets of phosphor layers 508 and 510 adjacently contact with each other without overlapping. Further, another function of the transparent layer 506 is enabling the light reflected from the interface between the transparent layer 506 and materials thereon (such as the first and second sets of phosphor layers 508 and 510) due to a difference of refractive indices or an influence of interlayer grain molecules to be directed to the reflective surface of the base 500 more possibly, but not to be absorbed by the first LED set 502 and the second LED set 504, thereby improving the luminescence efficiency.

As mentioned above, according to requirement or purpose, the first and second sets of phosphor layers 508 and 510 can be configured to cover different amounts of LED units. Referring to FIGS. 3B and 3C, the first set of phosphor layers 508 can be excited by the light emitted by the first LED set 502, thereby emitting fluorescence with a dominant wavelength ranging from 500 nm to 580 nm. On the other hand, the second set of phosphor layers 510 can be excited by the light emitted by the second LED set 504, thereby emitting fluorescence with a dominant wavelength ranging from 590 nm to 650 nm. The first and second sets of phosphor layers 508 and 510 can be a single fluorescent layer or multiple fluorescent layers, and the surface thereof can be hemispherical, convex, or planar.

Furthermore, a transparent packaging layer 516 is disposed for covering the first LED set 502, the second LED set 504, the transparent layer 506, the first set of phosphor layers 508, the second set of phosphor layers 510, and the input terminal 501, so as to prevent these elements from the influence of moisture. In addition, the transparent packaging layer 516 can be hemisphere, convex, tapered, or Fresnel-lens-shaped according to operational requirements and purposes. In other words, the shape of the transparent packaging layer 516 can be designed to maximize the light emitted by the first LED set 502, the second LED set 504, the first set of phosphor layers 508 and the second set of phosphor layers 510, so that the luminescence efficiency of the lighting device can be improved. The transparent packaging layer 516 can include at least one of a transparent polymeric material (such as epoxy, silicone, polyimide, acryl, polycarbonate (PC), or parylene), and a transparent material such as quartz or glass. Further, the structure of the transparent packaging layer 516 can be single-layered or multi-layered.

Figure 7B:
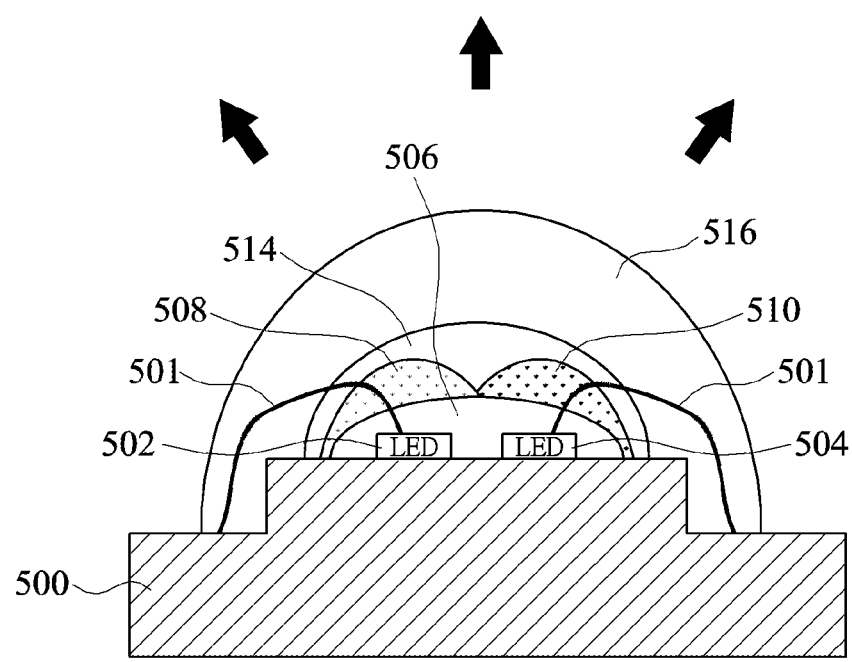
FIGS. 7B to 7E are cross-sectional views showing a derivative lighting device based on the lighting device shown in FIG. 7A according to an embodiment of the present invention.

FIGS. 7B to 7E are cross-sectional views showing a derivative lighting device based on the lighting device shown in FIG. 7A according to an embodiment of the present invention. In FIG. 7B, a diffusion layer 514 is firstly coated on the first and second sets of phosphor layers 508 and 510 described in FIG. 7A. Then the first LED set 502, the second LED set 504, the transparent layer 506, the first set of phosphor layers 508, the second set of phosphor layers 510, the diffusion layer 514 and the input terminal 501 are coated with the transparent packaging layer 516 to prevent these elements from the influence of moisture. The function of the diffusion layer 514 is to mix the light emitted by the first LED set 502 and the second LED set 504 more uniformly with the fluorescence emitted by the excited first and second sets of phosphor layers 508 and 510 for producing white light.

Figure 7C:
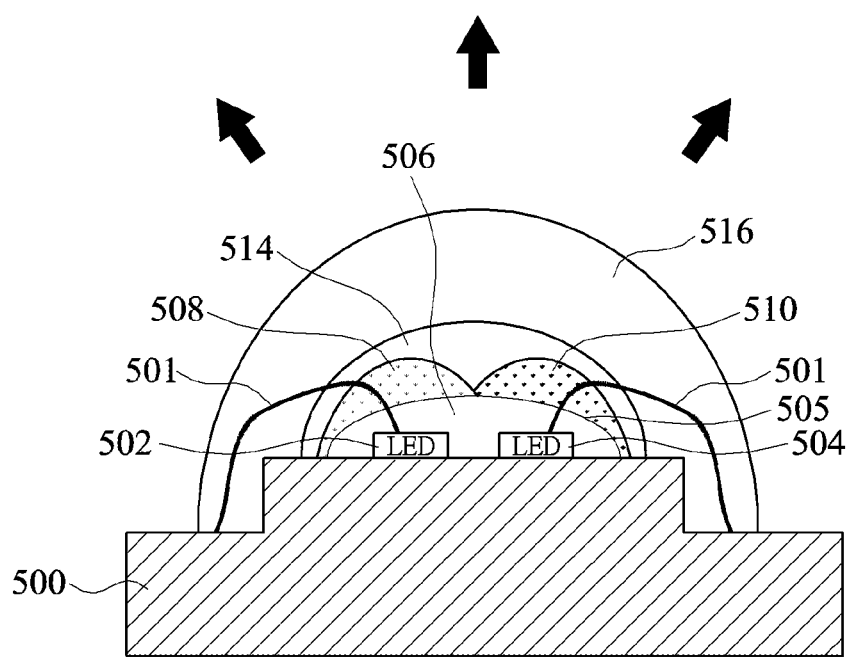

FIG. 7C illustrates that after the coating of the transparent layer 506 and before the coating of the first and second sets of phosphor layers 508 and 510, an anti-reflective coating (ARC) 505 is formed on the transparent layer 506 by employing at least one of spin-coating, dip-coating, chemical vapor deposition (CVD), thermal evaporation coating, and e-beam evaporation coating. For example, the ARC 505 can include but is not limited to a transparent layer of at least one of nitrocellulose, cellulose esters, cellulose acetate, cellulose acetate butyrate, Teflon®, Cytop, $SiO_2$, $SiN_x$, $SiO_xN_y$, $TiO_2$, MgO, and $MgF_2$. The ARC 505 can be configured to let the light within the coverage thereof (including the light emitted by the first LED set 502 and the second LED set 504, and the light reflected from the reflective surface of the base 500) pass through, and enable the light scattered by the interlayer grain molecules in the first set of phosphor layers 508 and the second set of phosphor layers 510 to be refracted again back to the exit direction (as shown by the arrow) on the interface between the first and second sets of phosphor layers 508 and 510 and the ARC 505, thereby increasing the luminescence efficiency of the lighting device.

Figure 7D:
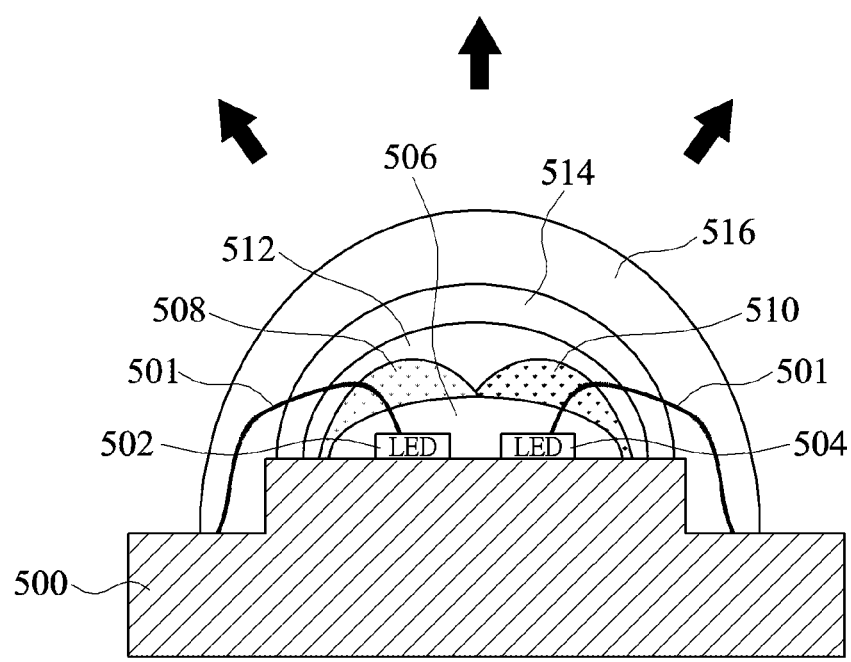

FIG. 7D illustrates a transparent layer 512 coated between the abovementioned first and second sets of phosphor layers 508 and 510 and the diffusion layer 514. The transparent layer 512 not only can further protect the first and second sets of phosphor layers 508 and 510 and structures thereunder from the influence of moisture, but also can enable the light reflected from the interface between the transparent layer 512 and materials thereon (such as the diffusion layer 514) due to a difference in refractive indices or an influence of interlayer grain molecules to be more possibly directed to the reflective surface of the base 500, but not to be directly absorbed by the fir and second sets of phosphor layers 508 and 510, thereby improving the luminescence efficiency. The transparent layer 512 can include at least one of a transparent polymeric material (such as epoxy, silicone, polyimide, acryl, polycarbonate (PC), or parylene), and a transparent material such as quartz or glass. In addition, the structure of the transparent layer 512 can be single-layered or multi-layered. The transparent layer 512 can be hemisphere, convex, tapered, or Fresnel-lens-shaped, and an adequate shape thereof is selected according to operational requirements and purposes to achieve a best extraction of the light emitted by the first LED set 502, the second LED set 504, the first set of phosphor layers 508, and the second set of phosphor layers 510.

Figure 7E:
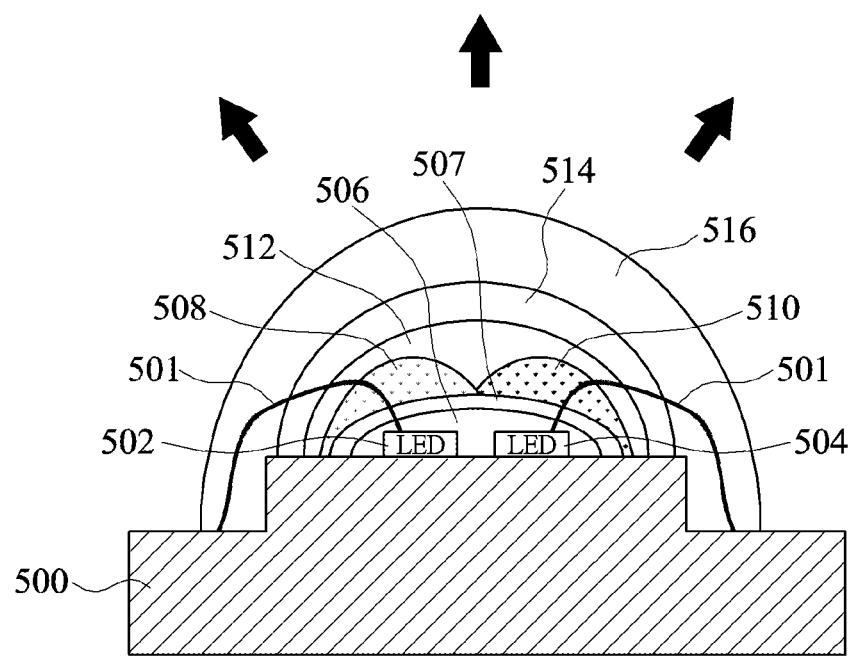

FIG. 7E illustrates a hollow layer 507 formed between the transparent layer 506 and the first and second sets of phosphor layers 508 and 510 mentioned above. The hollow layer 507 may comprise air. In consideration of reliability, the hollow layer 507 can further comprise $N_2$, Ar, or other inert gases. The thickness of the hollow layer 507 is within a range approximately between 0.01 mm and 10 mm. Since the refraction index of the hollow layer 507 is approximately 1 (the refraction indices of air, $N_2$, Ar, or other inert gases are approximately 1), and the refraction index of the phosphor layers is approximately 1.5, those skilled in the art should understand that a total reflection will not occur when the light enters the first and second sets of phosphor layers 508 and 510 from the hollow layer 507. Thus, the hollow layer 507 is configured to let the light emitted by the first and second LED sets 502 and 504 completely pass through the interface between the hollow layer 507 and the first and second sets of phosphor layers 508 and 510. On the other hand, the light scattering back from the first and second sets of phosphor layers 508 and 510 tends to be totally reflected due to the difference between the refraction indices of the hollow layer 507 and the phosphor layers, so as to decrease the possibility that the light is directly absorbed by the first set of phosphor layers 508, the second set of phosphor layers 510 and the transparent layer 506, thereby increasing the entire luminescence efficiency of the lighting device.

Those skilled in the art will understand that the hollow layer 507, the transparent layer 512 and the diffusion layer 514 illustrated in FIGS. 7B to 7E can be configured or omitted according to operational requirements and purposes. In other words, the embodiments in the specific description should not be understood as implying that these structures must simultaneously exist in the lighting device of the present invention.

Figures 8A, 8B:
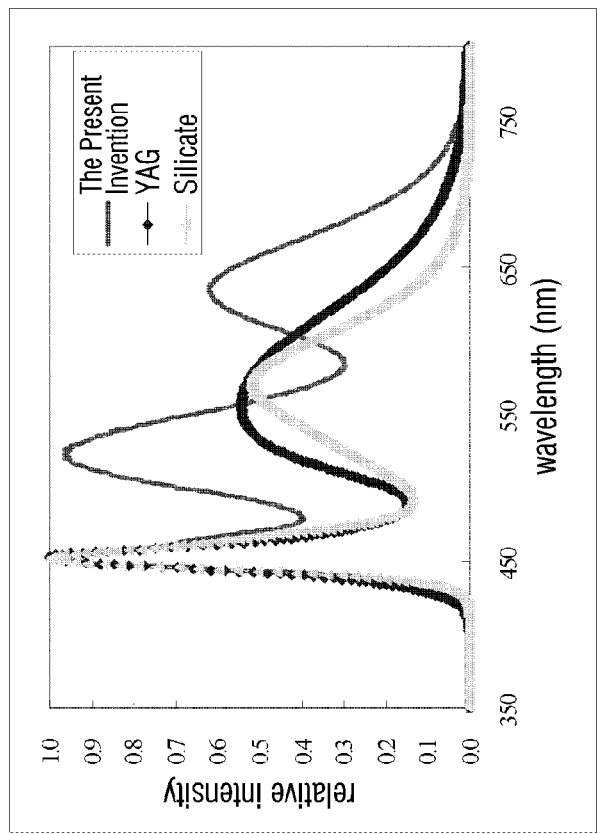
FIGS. 8A and 8B are comparisons of spectrums and color rendering indices between the present invention and a commercial and conventional lighting device (employing a phosphor layer of YAG or silicate).

FIGS. 8A and 8B respectively illustrate the comparison of the spectrums and color rendering indices (CRIs) between the present invention and a conventional lighting device using a combination of blue LED and mixed fluorescent materials (phosphor layers of YAG or silicate). With the configuration of the present invention, the optimum emission of blue light (360-490 nm), green fluorescence (500-580 nm), and red fluorescence (590-650 nm) can be achieved, thereby obtaining spectrums and CRIs which are more optimized compared to conventional lighting devices.

Figure 1:
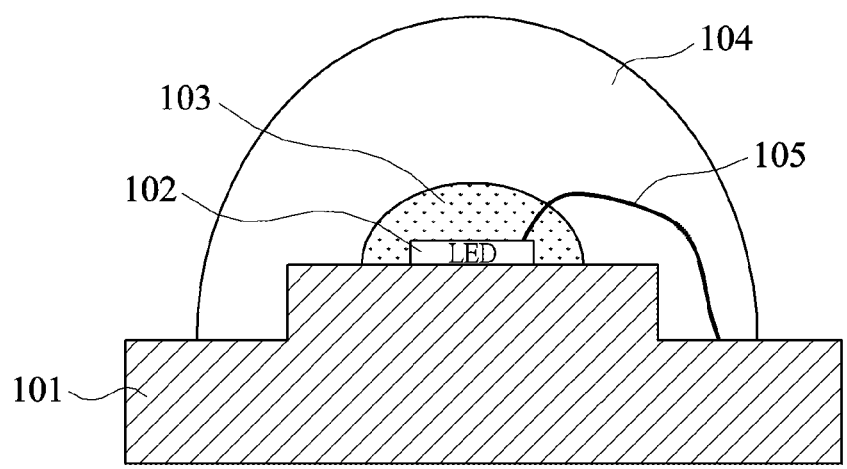
FIG. 1 is a schematic view showing a conventional lighting device employing a combination of a blue LED and a mixed fluorescent material.
Figure 2:
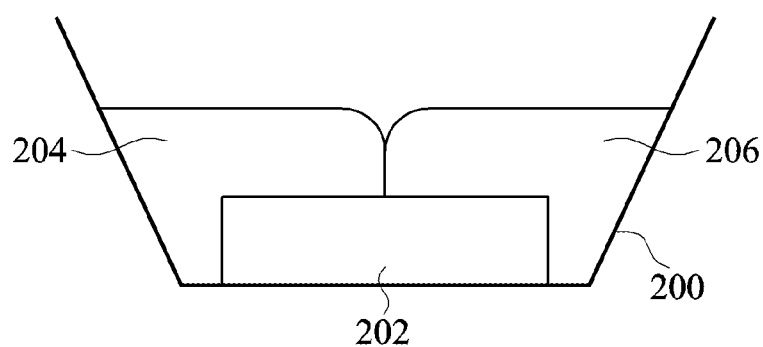
FIG. 2 is a schematic view showing a conventional lighting device employing a combination of a blue LED, a yellow-green fluorescent coating, and a red fluorescent coating.

Besides, referring to Table 1, if two 1 mm$^2$ GaN LED sets with different peak emission wavelengths, green fluorescent material (peak emission wavelength=521 nm, dominant wavelength=534 nm) and red fluorescent material (peak emission wavelength=635 nm, dominant wavelength=611 nm) are employed in both aspects, the brightness of the present invention is 26.7% higher than prior art. In the above experiment, the configuration of the present invention is as mentioned above, that is, a phosphor layer of green fluorescent material is coated on one of the two 1 mm$^2$ GaN LED sets, while a phosphor layer of red fluorescent material is coated on the other one of the two 1 mm$^2$ GaN LED sets (see FIG. 7A). On the other hand, in prior art, a phosphor layer is formed by mixing the green fluorescent material with the red fluorescent material, and next coated on the two 1 mm$^2$ GaN LED sets (see FIG. 1).

TABLE 1

| Aspect | Color temperature (CCT) | Color Rendering Index (CRI) | Total Flux (lumens) | Ratio of Brightness Enhancement (%) |
|---|---|---|---|---|
| Present Invention | 5500 K | 92.1 | 91.3 | 126.7 |
| Prior Art (Phosphor layer with mixed fluorescent materials) | 5500 K | 91.2 | 72.1 | 100 |

It should be noted that there is no necessary correspondence between the first and second LED sets and the first and second sets of phosphor layers mentioned in the above embodiments or accompanying drawings. In other words, the first set of phosphor layers does not necessarily correspond to the first LED set, and the second set of phosphor layers does not necessarily correspond to the second LED set as well. Therefore, the numbers of the LED sets (the first LED set and the second LED set) and the sets of phosphor layers (the first set of phosphor layers and the second set of phosphor layers) described in the specification or labeled in the accompanying drawings are only used for descriptive purpose and should not be taken as limitations.

While the invention has been described in terms of several exemplary embodiments, those skilled in the art will recognize that the invention can be practiced with various substitutions, additions, modifications and equivalent operations. Therefore, the present invention encompasses all of the substitutions, additions, modifications and equivalent operations that fall within the real spirit and scope of the appended claims and the invention is not limited to the examples described above.

The invention claimed is:

1. A lighting device, comprising:
   a plurality of light emitting diode (LED) sets, wherein at least two of the plurality of LED sets have peak emission wavelengths different from each other;
   a plurality of sets of phosphor layers respectively coated on corresponding LED sets among the plurality of LED sets, at least one of the plurality of sets of phosphor layers being adapted to be excited by a portion of light emitted by the corresponding LED set thereof to emit light having a dominant wavelength ranging form 500 nm to 580 nm, and at least another one of the plurality of sets of phosphor layers being adapted to be excited by a portion of light emitted by the corresponding LED set thereof to emit light having a dominant wavelength ranging from 590 nm to 650 nm; and
   an input terminal connected to the plurality of LED sets for providing energy thereto for enabling the plurality of LED sets to emit light.

2. The lighting device of claim 1, wherein the peak emission wavelengths of the plurality of LED sets are within the range between 360 nm and 490 nm.

3. The lighting device of claim 1, wherein each of the plurality of LED sets includes at least one LED unit.

4. The lighting device of claim 1, wherein the plurality of LED sets are parallelly connected.

5. The lighting device of claim 1, wherein the plurality of LED sets are serially connected.

6. The lighting device of claim 3, wherein the LED units in the plurality of LED sets are parallelly connected.

7. The lighting device of claim 3, wherein the LED units in the plurality of LED sets are serially connected.

8. The lighting device of claim 3, wherein at least two of the plurality of LED sets include the same amount of the LED units.

9. The lighting device of claim 3, wherein at least two of the plurality of LED sets include different amounts of the LED units.

10. The lighting device of claim 3, wherein the sizes of the LED units in the plurality of LED sets are the same.

11. The lighting device of claim 3, wherein the sizes of the LED units in the plurality of LED sets are different.

12. The lighting device of claim 1, wherein the plurality of LED sets are adapted to be controlled separately.

13. The lighting device of claim 3, wherein the LED units in the plurality of LED sets are adapted to be controlled separately.

14. The lighting device of claim 1, wherein any one of the plurality of sets of phosphor layers includes at least a fluorescent layer.

15. The lighting device of claim 1, wherein the surfaces of the plurality of sets of phosphor layers are hemispherical, convex, or planar.

16. The lighting device of claim 3, wherein the amounts of the LED units covered by the plurality of sets of phosphor layers are the same or different.

17. The lighting device of claim 1, wherein the plurality of sets of phosphor layers adjacently contact with each other without overlapping.

18. The lighting device of claim 1, further comprising a concave structure with a reflective inner surface, the plurality of LED sets being disposed on the reflective inner surface of the concave structure, and the reflective inner surface of the concave structure being able to reflect the light emitted by the plurality of LED sets and the plurality of sets of phosphor layers.

19. The lighting device of claim 1, further comprising a transparent layer coated on the plurality of sets of phosphor layers.

20. The lighting device of claim 19, wherein the transparent layer includes at least one transparent material of epoxy, silicone, polyimide, glass, quartz, acryl, polycarbonate (PC), or parylene.

21. The lighting device of claim 19, wherein the transparent layer comprises a monolayer structure or a multilayer structure.

22. The lighting device of claim 19, further comprising an anti-reflective coating disposed on the transparent layer.

23. The lighting device of claim 22, wherein the anti-reflective coating includes at least one transparent material of nitrocellulose, cellulose esters, cellulose acetate, cellulose acetate butyrate, Teflon, Cytop, $SiO_2$, $SiN_x$, $SiO_xN_y$, $TiO_2$, MgO, or $MgF_2$.

24. The lighting device of claim 22, wherein the anti-reflective coating is formed by at least one of spin-coating, dip-coating, chemical vapor deposition (CVD), thermal evaporation coating, and e-beam evaporation coating.

25. The lighting device of claim 1, further comprising:
a diffusion layer disposed above the plurality of sets of phosphor layers for enabling the light emitted by the plurality of sets of phosphor layers and the plurality of LED sets to be mixed more uniformly.

26. A lighting device, comprising:
a base;
a plurality of LED sets, wherein at least two of the plurality of LED sets have peak emission wavelengths different from each other;
a first transparent layer disposed above the plurality of LED sets;
a plurality of sets of phosphor layers coated on the first transparent layer and respectively corresponding to each LED set among the plurality of LED sets, at least one of the plurality of sets of phosphor layers being adapted to be excited by a portion of light emitted by the corresponding LED set thereof to emit light having a dominant wavelength ranging form 500 nm to 580 nm, and at least another one of the plurality of sets of phosphor layers being adapted to be excited by a portion of light emitted by the corresponding LED set thereof to emit light having a dominant wavelength ranging from 590 nm to 650 nm; and
an input terminal connected to the plurality of LED sets for providing energy thereto for enabling the plurality of LED sets to emit light.

27. The lighting device of claim 26, wherein the base has a reflective surface, the plurality of LED sets are disposed on the reflective surface of the base, and the reflective surface reflects the light emitted by the plurality of LED sets and the plurality of sets of phosphor layers.

28. The lighting device of claim 26, wherein the peak emission wavelengths of the plurality of LED sets are within the range between 360 nm and 490 nm.

29. The lighting device of claim 26, wherein each of the plurality of LED sets includes at least one LED unit.

30. The lighting device of claim 26, wherein the plurality of LED sets are parallelly connected.

31. The lighting device of claim 26, wherein the plurality of LED sets are serially connected.

32. The lighting device of claim 29, wherein the LED units in the plurality of LED sets are parallelly connected.

33. The lighting device of claim 29, wherein the LED units in the plurality of LED sets are serially connected.

34. The lighting device of claim 29, wherein at least two of the plurality of LED sets include the same amount of the LED units.

35. The lighting device of claim 29, wherein at least two of the plurality of LED sets include different amounts of the LED units.

36. The lighting device of claim 29, wherein the sizes of the LED units in the plurality of LED sets are the same.

37. The lighting device of claim 29, wherein the sizes of the LED units in the plurality of LED sets are different.

38. The lighting device of claim 26, wherein the plurality of LED sets are adapted to be controlled separately.

39. The lighting device of claim 29, wherein the LED units in the plurality of LED sets are adapted to be controlled separately.

40. The lighting device of claim 26, wherein any one of the plurality of sets of phosphor layers includes at least a fluorescent layer.

41. The lighting device of claim 26, wherein the surfaces of the plurality of sets of phosphor layers are hemispherical, convex, or planar.

42. The lighting device of claim 26, wherein the amounts of the LED units covered by the plurality of sets of phosphor layers are the same or different.

43. The lighting device of claim 26, wherein the plurality of sets of phosphor layers adjacently contact with each other without overlapping.

44. The lighting device of claim 26, wherein the first transparent layer includes at least one transparent material of epoxy, silicone, polyimide, glass, quartz, acryl, polycarbonate (PC), or parylene.

45. The lighting device of claim 44, wherein the first transparent layer comprises a monolayer structure or a multilayer structure.

46. The lighting device of claim 26, wherein the first transparent layer is hemisphere, convex, tapered, or Fresnel-lens-shaped.

47. The lighting device of claim 26, further comprising an anti-reflective coating disposed between the first transparent layer and the plurality of sets of phosphor layers.

48. The lighting device of claim 47, wherein the anti-reflective coating includes at least one transparent material of nitrocellulose, cellulose esters, cellulose acetate, cellulose acetate butyrate, Teflon, Cytop, $SiO_2$, $SiN_x$, $SiO_xN_y$, $TiO_2$, MgO, or $MgF_2$.

49. The lighting device of claim 47, wherein the anti-reflective coating is formed by at least one of spin-coating, dip-coating, chemical vapor deposition (CVD), thermal evaporation coating, and e-beam evaporation coating.

50. The lighting device of claim 26, further comprising:
a hollow layer disposed between the first transparent layer and the plurality of sets of phosphor layers, the thickness of the hollow layer being between 0.01 mm and 10 mm.

51. The lighting device of claim 50, wherein the hollow layer includes air.

52. The lighting device of claim 50, wherein the hollow layer includes $N_2$, Ar, or other inert gases.

53. The lighting device of claim 26, further comprising:
a diffusion layer disposed above the plurality of sets of phosphor layers for enabling the light emitted by the plurality of LED sets and the plurality of sets of phosphor layers to be mixed more uniformly.

54. The lighting device of claim 53, further comprising:
a second transparent layer disposed between the diffusion layer and the plurality of sets of phosphor layers and configured to further protect the plurality of sets of phosphor layers and a structure thereunder from an influence of moisture.

55. The lighting device of claim 54, wherein the second transparent layer includes at least one transparent material of epoxy, silicone, polyimide, glass, quartz, acryl, polycarbonate (PC), or parylene.

56. The lighting device of claim 54, wherein the second transparent layer comprises a monolayer structure or a multilayer structure.

57. The lighting device of claim 54, wherein the second transparent layer is hemisphere, convex, tapered, or Fresnel-lens-shaped.

58. The lighting device of claim 26, further comprising a transparent packaging layer disposed above the plurality of sets of phosphor layers.

59. The lighting device of claim 58, wherein the transparent packaging layer includes at least one transparent material of epoxy, silicone, polyimide, glass, quartz, acryl, polycarbonate (PC), or parylene.

60. The lighting device of claim 58, wherein the transparent packaging layer is hemispherical, convex, tapered or Fresnel-lens-shaped.

61. The lighting device of claim 58, wherein the transparent packaging layer comprises a monolayer structure or a multilayer structure.

62. The lighting device of claim 26, wherein the base is formed of a metal matrix composite.

* * * * *